(12) United States Patent
Immorlica et al.

(10) Patent No.: US 8,003,504 B2
(45) Date of Patent: Aug. 23, 2011

(54) STRUCTURE AND METHOD FOR FABRICATION OF FIELD EFFECT TRANSISTOR GATES WITH OR WITHOUT FIELD PLATES

(75) Inventors: Anthony A. Immorlica, Mont Vernon, NH (US); Pane-chane Chao, Nashua, NH (US); Kanin Chu, Nashua, NH (US)

(73) Assignees: BAE Systems Information and Electronic Systems Integration Inc., Nashua, NH (US); Biogen IDEC MA Inc., Cambridge, MA (US)

( * ) Notice: Subject to any disclaimer, the term of this patent is extended or adjusted under 35 U.S.C. 154(b) by 464 days.

(21) Appl. No.: 12/086,854

(22) PCT Filed: Aug. 31, 2007

(86) PCT No.: PCT/US2007/019284
§ 371 (c)(1),
(2), (4) Date: Jun. 20, 2008

(87) PCT Pub. No.: WO2008/027593
PCT Pub. Date: Mar. 6, 2008

(65) Prior Publication Data
US 2010/0163936 A1 Jul. 1, 2010

Related U.S. Application Data

(60) Provisional application No. 60/841,742, filed on Sep. 1, 2006.

(51) Int. Cl.
*H01L 21/28* (2006.01)
(52) U.S. Cl. ........ 438/582; 438/571; 438/618; 438/685; 257/E21.24; 257/E21.374; 257/E21.4

(58) Field of Classification Search .................. 438/159, 438/575, 578, 580, 621, 641; 257/E21.051, 257/E21.055, E21.064, E21.065, E21.177, 257/E21.359, E21.37, E21.374, E21.4, E21.457, 257/E21.615
See application file for complete search history.

(56) References Cited

U.S. PATENT DOCUMENTS

| 2006/0223293 | A1* | 10/2006 | Hwang et al. | 438/572 |
| 2007/0018198 | A1* | 1/2007 | Brandes et al. | 257/183 |
| 2008/0224184 | A1* | 9/2008 | Shannon et al. | 257/288 |

OTHER PUBLICATIONS

Karmalkar, et al., "Enhancement of Breakdown Voltage in AlGaN/GaN High Electron Mobility Transistors Using a Field Plate," IEEE Transactions on Electron Devices, vol. 48, No. 8, pp. 1515-1521, Aug. 2001.
Wu, et al., "30-W/mm GaN HEMTs by Field Plate Optimization," IEEE Electron Device Letters, vol. 25, No. 3, pp. 117-119, Mar. 2004.
Wu, et al., "High-gain Microwave GaN HEMTs with Source-terminated Field-plates," IEEE IEDM Technical Digest, pp. 1078-1079, Dec. 2004.

* cited by examiner

*Primary Examiner* — Cheung Lee
(74) *Attorney, Agent, or Firm* — Daniel J. Long; Robert K. Tendler

(57) ABSTRACT

A method for fabrication of a field effect transistor gate, with or without field plates, includes the steps of defining a relatively thin Schottky metal layer by a lithography/metal liftoff or metal deposition/etch process on a semiconductor surface. This is followed by depositing a dielectric passivation layer over the entire wafer and defining a second lithographic pattern coincident with or slightly inset from the boundaries of the previously defined metal gate layer. This is followed by etching the dielectric using dry or wet etching techniques and stripping the resist, followed by exposing and developing a third resist pattern to define the thicker gate metal layers required for electrical conductivity and also for the field plate if one is utilized. The final step is depositing gate and/or field plate metal, resulting in a gate electrode and an integral field plate.

13 Claims, 7 Drawing Sheets

STRUCTURE AND METHOD FOR FABRICATION OF FIELD EFFECT TRANSISTOR GATES WITH OR WITHOUT FIELD PLATES

RELATED APPLICATIONS

This Application claims rights under 35 USC §119(e) from U.S. application Ser. No. 60/841,742 filed Sep. 1, 2006, the contents of which are incorporated herein by reference.

STATEMENT OF GOVERNMENT INTEREST

This invention was made with United States Government support under Contract No. W911QX-05-C-0087 awarded by the United States Army Research Laboratory. The United States Government has certain rights in this invention.

FIELD OF THE INVENTION

This invention relates to transistors and more particularly to structures and methods for fabrication of field effect transistor gates with or without field plates.

BACKGROUND OF THE INVENTION

In high-power field effect transistors, in order to increase the power output, in the past field plates have been provided. These field plates help reduce the peak electric field and also help control some of the surface charge so that the device is able to operate at higher voltages and thus operate at higher power outputs. It is noted that these FET-based amplifiers are designed to operate in the MegaHertz range up to the tens of GigaHertz.

By way of background, silicon-based field effect transistors and more recently gallium arsenide-based field effect transistors have been used to provide the architecture for high-power devices.

While silicon and gallium arsenide devices have been utilized in the past, more recently these high-power devices take advantage of the properties of gallium nitride material to increase the voltage that can be applied to the device to in excess of 40 volts, thus to increase output power. It is of course noted that the power for the transistor amplifier depends on the size of the device. Assuming a power density that is normalized to the device periphery, it would be desirable to obtain about 10 watts per millimeter biased on the 40-volt range. This 10-watt-per-millimeter design goal is about ten times what one can achieve using silicon or gallium arsenide.

In typical applications for field effect transistor amplifiers such devices operate up to about 100 watts output power, although several hundred watts in output power are not out of the question for discrete devices.

The reason that the industry has gravitated to gallium nitride as opposed to gallium arsenide is the fact that gallium nitride is a wide band-gap semiconductor material with a relatively high saturated electron velocity of $1.5\text{-}2\times10^7$ cm/s. A wide band-gap material is a material having a property that allows high electric fields to be applied without the material breaking down. As a result, one can apply higher voltages to devices, with higher voltages leading to higher RF output power for the individual devices.

However, due to the lack of reproducible lattice-matched substrates and relative immaturity of AlGaN/GaN processing technology, many bulk and surface defects exist in the device material. Bulk traps, due primarily to threading dislocations in the material, reduce the sheet carrier concentration, and therefore microwave performance of the device. Bulk and surface traps give rise to gate and drain lag that is a source of dispersion in the device, which impacts large-signal power performance.

Advanced device designs have been pursued in the industry to reduce trapping effects and boost GaN device performance and reliability. Among these designs, implementing a field plate on a dielectric layer at the drain side of the gate electrode has resulted in the most significant enhancement. The function of a field plate is to modify the electric field profile and to decrease its peak value at the gate edge, hence reducing trapping and increasing breakdown voltage. Power densities exceeding 30 W/mm at 4 GHz has been demonstrated with a field plate design.

There are basically two ways of fabricating field plate electrodes, one being a dry etch process, which creates an integrated gate/field plate structure. The other method utilizes field plates that are separately defined and are externally connected to the gate or source electrode on the chip.

S. Karmalkar and U. K. Mishra, "Enhancement of Breakdown Voltage in AlGaN/GaN High Electron Mobility Transistors Using a Field Plate," IEEE Trans. Electron Devices, vol. 48, pp. 1315-1521, 2001 discloses a prior art method in which the field plate is defined as part of the gate electrode.

Y. -F. Wu, A. Saxler, M. Moore, R. P. Smith, S. Sheppard, P. M. Chavarkar, T. Wisleder, U. K. Mishra, and P. Parikh, "30-W/mm GaN HEMTs by Field Plate Optimization," IEEE Electron Device Lett., vol. 25, March 2004, and Y. -F. Wu, M. Moore, T. Wisleder, P. M. Chavarkar, U. K. Mishra and P. Parikh, "High-gain microwave GaN HEMTs with source-terminated field-plates," IEEE IEDM Technical Digest, pp. 1078-1079, December 2004, disclose a method in which the field plate is separately defined but directly connected to the gate or source electrode on chip.

One criterion for the provision of a field plate electrode is that one has to place the field plate electrode very close to the gate of the field effect transistor for it to be effective. In the Karmalkar et al. method, one derives an integrated structure such that the field plate and the gate are in essence one electrode. Thus there is no spacing problem.

This technique is generally referred to as a dielectric-assisted T-gate process. In this process one puts a passivation layer on a substrate before any gate metal is put down. One then utilizes some etching technique, usually dry chemistry or plasma etching, to open a trench in the passivation layer to contact the semiconductor substrate. After this process of opening up the contact area, one deposits metal that fills the trench and also forms the field plate extension that goes to either side of the actual gate connection.

Note that the field plate allows a spreading of the electric field so that the total voltage that can be applied to the device is higher. The field plate extension is also useful in controlling the surface states that are close to the gate, which helps with reducing any dispersive effect that comes from the surface states in semiconductors.

However, the dry etch technique described above is relatively difficult to control because when one has a plasma etch with active ions that are hitting the surface to perform the removal of the passivation layer, one always has to do an over-etch to ensure complete removal of passivation dielectric material. During the over-etch, the semiconductor material at the bottom of the trench is exposed to the plasma and because of the energy that the ions carry, the semiconductor substrate is damaged. In particular, there is atomic-level damage in the semiconductor itself that can penetrate up to hundreds of angstroms. Depending on the plasma energy, as much as 200 to 300 angstroms of damage can result, which is quite normal in the dielectric-assisted T-gate process.

Damage to the gate area causes a reduction in the power output of the device because many electronic traps are generated. The traps are material defects in the crystal that can hold electrons. One does not want to retain electrons in the gate area because one wants the electrons to be in the active channel where the current is being carried. If the traps hold some of the electrons, the result is that one does not have as many electrons as one would like to carry the current. The result is that the power output of the discrete device is significantly reduced.

There is another problem with respect to the etching technique described above and that is one of reliability. When one has material defects, the material itself is less capable of holding the high electric field that is applied to the physical areas of the device. Thus, the material utilized in the field effect transistor degrades over time if dry etching is used, which means that the reliability of the device is lower than one would expect, assuming no plasma damage.

Moreover, with the dielectric-assisted T-gate approach, the critical gate dimension formed by dry etching and opening is considerably less well controlled than is desired. It is this gate dimension that is critical to device operation.

The above-mentioned over-etching results in trench sidewalls whose positions are not sufficiently well defined. When the gate metal is deposited in the trench, it spreads out in the over-etched areas. This means that the size and shape of the gate contact area with the substrate cannot be well controlled.

In order to eliminate the problems associated with the dielectric-assisted T-gate approach for forming a field plate at the gate of the device, a separate gate/field plate approach has been used in which the gate and the field plate are deposited in separate lithography steps and separate metallization steps. This gets away from the dry etch damage as well as the difficulty in dimension control as mentioned above.

Separating the field plate and the gate works to some extent but one cannot put the field plate exactly next to the gate contact of the semiconductor. At the very least, the field plate has to be separated by the thickness of the passivation layer. It will be appreciated that the extra separation makes the device performance inferior to the integrated approach above.

In short, the field plate is separated by as much as the thickness of the passivation layer. The passivation layer is typically on the order of 1,000 angstroms for normal devices. Thus there is quite a substantial distance from the edge of the gate electrode to the field plate. If the gate dimension is on the order of 0.25 microns and assuming a 1,000-angstrom passivation layer, this is equivalent to a spacing of 0.1 micron out of the 0.25-micron dimension, which is substantial. There is thus quite a substantial distance from the edge of the gate electrode to the field plate.

Also, when utilizing a separate gate and field plate, one has to connect them externally together. When one has an electrical contact that is external to the active area of the device, the field plate and the gate plate connect to the same bar of metal outside so they are under the same electrical bias. This presents a number of problems.

First, this technique opens up the device to potential metal connect reliability issues because one has a separate metal connect that one is making. Moreover, this technique also induces another effect when one is operating at high frequencies. There is a phase difference between the electrical signal traveling down the field plate and the one going down the gate. If one is feeding them at the same point, because the gate and the field plate are presenting different impedances to the point that one is applying the RF to, the signals travel slightly out of phase and could potentially lead to a fighting out-of-phase condition between the field plate and the gate. The result is that one is not extracting the maximum effect that one would seek from the utilization of the field plate.

In summary, the prior art methods may have a number of disadvantages. The prior art method of etching all the way to the semiconductor surface results in damage to the surface, leading to increased leakage current and poor reliability and device performance. Damage is particularly severe with "dry" etching techniques such as Reactive Ion Etching or Inductively Coupled Plasma etching. Alternative wet chemical etching techniques are often less damaging, but a wet etch processes result in undesirable "undercut" of the resist pattern, leaving a widened and non-uniform gate length. In the separate gate and field plate technique, the gate is defined with standard lithography techniques, after which the passivation dielectric is deposited. This eliminates the need to etch through the dielectric, but results in a "gap" between the gate and field plate, reducing field plate effect and requiring that the electrical connection be made remotely.

A need, therefore, exists for an improved method for fabrication of field effect transistor gates with or without field plates. More specifically there is a need to: (1) eliminate damage inherent in the dielectric gate etch process, (2) decrease gate leakage current which is the result of damage during formation of the gate, and (3) reduce or eliminate the impact of traps in the gate/drain region of the transistor.

SUMMARY OF INVENTION

According to the present invention, a method has been devised that retains all the advantages of forming a gate through a previously deposited dielectric but eliminates damage to the semiconductor surface. This result is accomplished by first depositing a relatively thin metal, normally the first Schottky metal layer of the gate, on the semiconductor surface before deposition of the dielectric, and then etching through the dielectric to reach the Schottky metal which defines the critical transistor gate length. Additional metal is then defined and deposited on the thin Schottky metal to increase the gate cross-section and, if desired, to form a field plate which is integrally connected to the gate.

As a result of the above technique, one utilizes the integrated process but adds an additional step of putting down a thin gate metal on the semiconductor, after which a passivation layer is deposited. One then performs a dry etch conducted on the passivation layer. It is a feature of the subject invention that the dry etch will stop at the gate metal layer.

With the gate metal layer being in place, it serves two purposes. The first is to form a Schottky contact at the gate and the second is to protect the semiconductor from dry etch damage, since the plasma etch terminates when it hits the thin Schottky metal. This results in a higher-power device and better reliability as well as lower gate leakage.

It is understood that in the dielectric-assisted T-gate process, when one dry etches one produces undercuts in the photolithography pattern. This undermines the actual dimension of the gate electrode, which dimension is critical. Not only does the utilization of the subject technique eliminate the plasma damage mentioned above, but it also preserves the actual and originally patterned dimensional accuracy of the gate electrode, thus to preserve the originally designed gate length.

For instance, in performing photolithography and assuming a spread of critical dimension across the wafer of, for instance, 0.1 micron, when doing the dry etch, the dry etch could incur an extra non-uniformity of, for example, 0.05 micron on top of the original dimensional non-uniformity of 0.1 micron. One therefore has a total non-uniformity of about 0.15 micron across the wafer. Thus, the initial lithography dimensions in the dielectric-assisted T-gate process are degraded by the dry etch process.

However, with the subject technique one only incurs the initial 0.1 micron of non-uniformity across the wafer. As a result, the subject process will always have a dimensional accuracy better than performing a separate dry etch process.

Regardless of the dimensional accuracy to which the gate can be manufactured, there is the question of reduced gate leakage. The reason that there is reduced gate leakage is because one does not have damaged semiconductor material. It is noted that in an ideal field effect transistor, one would want the gate Schottky contact to be very low leakage, ideally having a zero leakage. In this case, the gate Schottky contact should not draw any current on the gate. When one starts to draw current on the gate electrode, one degrades the device efficiency and makes it more difficult to account for current that would be drawn on the gate electrode during amplifier designs.

In summary, when utilizing the dry etch process, it is certainly more difficult to come up with a process that works very well and still will incur low leakage. If one uses a direct etch process without the subject technique, one could potentially incur a gate leakage that is an order or two of magnitude higher than when utilizing the metal layer protection between the dry etch and the semiconductor.

While the subject devices have major utility in military applications, such as radars and the like, in the commercial realm the focus for such high-power transistors is in cellular base stations which operate in the lower microwave range, for instance, from 2 to 5 GigaHertz.

Base station transmitters for cell towers are based on silicon LDMOS devices in which LDMOS refers to lightly-doped-drain metal-oxide-semiconductor field-effect transistors.

The gallium nitride devices with field plates provide much higher power and produce better linearity than standard LDMOS FETs, which is very important in the cell phone applications. Also, the gallium nitride devices have lower cooling requirements due to the larger bandgap and lower intrinsic carrier concentration. The use of gallium nitride devices thus reduces the cost that one would have to incur when one is setting up a new cellular base station.

Whether utilizing gallium arsenide or gallium nitride or in fact any other FET device, the subject fabrication technique provides improved results. The subject technique is optimally efficient due to the utilization of the thin refractory metal layer that not only serves to shut off the gate contact, but also is a protective layer during the dry etch process. The refractory metal layer permits control of the very critical gate length because it permits utilizing a very well controlled conventional photolithographic technique for gate length. As compared with the dielectric-assisted T-gate approach with the absence of the refractory metal layer, the critical gate length dimension is the dry etch opening, which is much less well controlled compared to the direct lithography utilized with the refractory metal layer patterning.

In summary, a method for fabrication of a field effect transistor gate, with or without field plates, includes the steps of defining a relatively thin Schottky metal gate by a lithography/metal liftoff or metal deposition/etch process on a semiconductor surface. This is followed by depositing a dielectric passivation layer over the entire semiconductor surface and defining a second lithographic pattern coincident with or slightly inset from the boundaries of the previously defined metal gate layer. This is followed by etching a dielectric opening using dry or wet etching techniques and stripping the resist, followed by exposing and developing a third resist pattern to define the thicker gate metal layers required for electrical conductivity and also for the field gate if one is utilized. The final step is depositing the gate electrode and an integral field plate if desired.

BRIEF DESCRIPTION OF THE DRAWINGS

These and other features of the subject invention will be better understood in connection with the Detailed Description, in conjunction with the Drawings, of which.

DETAILED DESCRIPTION

Figure 1A:
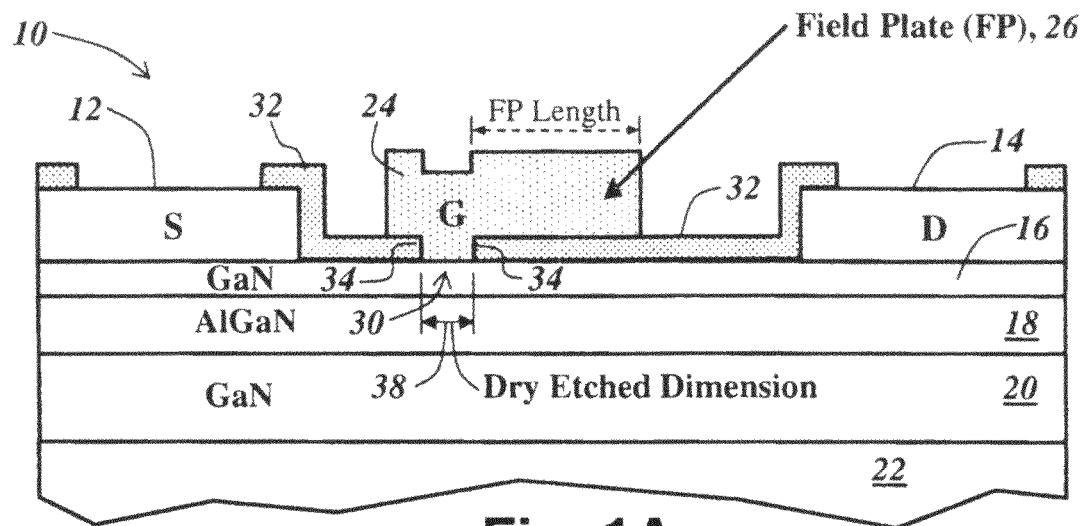
FIG. 1A is a prior art diagrammatic illustration of the dielectric-assisted T-gate approach to providing a field plate for a field effect transistor in which the critical gate electrode dimension at the substrate is not well controlled.

Referring now to FIG. 1A, in the prior art direct etch technique described above, a field effect transistor 10 is provided with a source 12 and a drain 14 on top of a gallium nitride layer 16, which is in turn deposited over an aluminum gallium nitride layer 18, which is on top of a gallium nitride layer 20.

Note that the base of the field effect transistor 22 can be either of, but not limited to, silicon, silicon carbide, sapphire, aluminum nitride or gallium nitride on which the gallium nitride layers are deposited.

In order to provide the gate, here illustrated at 24, or an integral field plate 26, the active area of the device is defined by either mesa etching or ion implantation.

For the active area in the prior art process, passivation layer 32 is formed over the source, drain and gallium nitride layer 16, at which point an opening at 30 is provided in passivation layer 32 by direct ion etching.

This direct ion etching is supposed to provide passivation layer 32 with correctly dimensioned sidewalls 34 so that the gate metal layer 24 is deposited over passivation layer 32, the gate electrode 24 will have a critical dimension indicated by double-ended arrow 38 that defines the dry etched dimension.

Figure 1B:
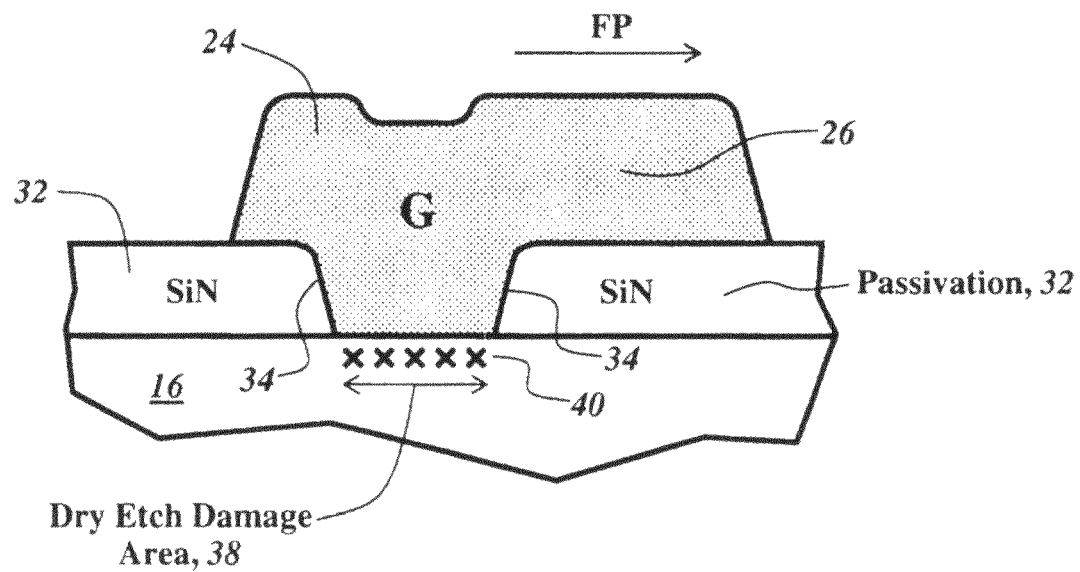
FIG. 1B is a diagrammatic illustration of the area of dry etch damage when utilizing the dielectric-assisted T-gate technique for providing the gate and integral field plate.

However, as can be seen in FIG. 1B, walls 34 in the silicon nitride passivation layer 32 are not dimensionally accurate enough and slope inwardly such that the critical dimension 38, here the gate length, is not very well controlled.

What this means is that when the gate 24 and/or its integral field plate 26 are deposited over the passivation layer and onto the exposed substrate, the critical gate electrode dimension is not adequately controlled.

Moreover, as can be seen by the Xs at 40, there is semiconductor crystal damage near the surface of the gallium nitride layer 16 such that electron trapping and other deleterious effects occur.

It is thus the lack of ability to define the critical dimension for the gate electrode, along with the damage caused by dry etch process, that is problematic for the method described in FIG. 1A.

Figure 2:
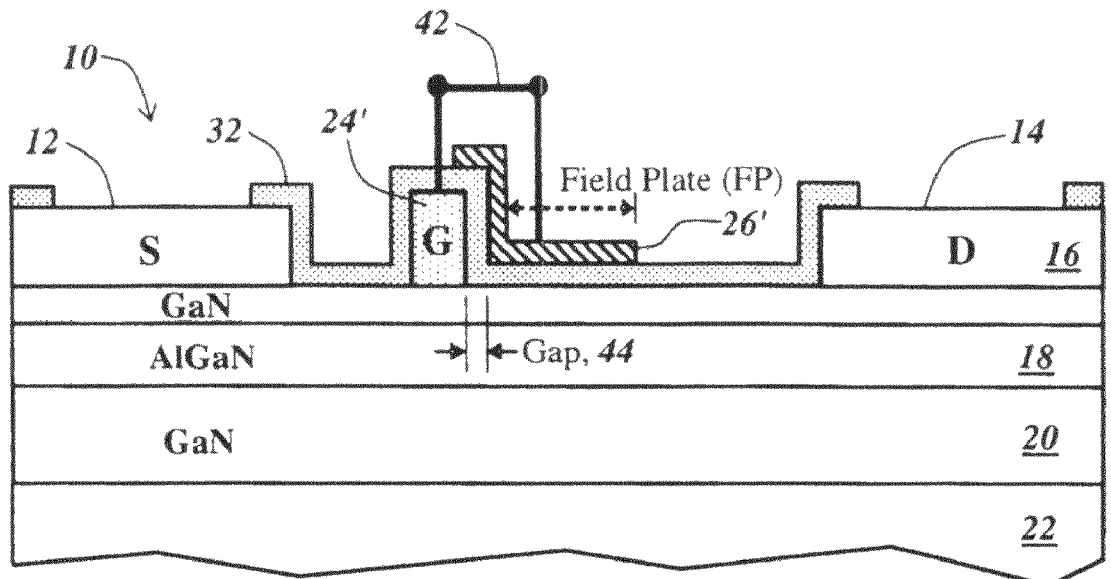
FIG. 2 is a prior art diagrammatic illustration of the use of a separate gate and field plate externally interconnected in which there is a gap between the field plate and the gate electrode.

In order to get away from the deleterious effects of the dry etch process shown in FIG. 1A and referring now to FIG. 2, field effect transistor 10 built on top of layers 16, 18, 20 and 22 is provided with a separate gate 24' and field plate 26', with gate 24' and field gate 26' being connected externally as illustrated at 42.

The problem with such a configuration is that there is a gap 44 between field plate 26' and the gate electrode 24', which reduces the effectiveness of the field plate 26' in controlling surface states next to gate electrode 24'. Also a problem is the external connection. Note that there is a separation of the field plate with respect to the gate, which is at least the dimension of the passivation layer.

Figure 3:
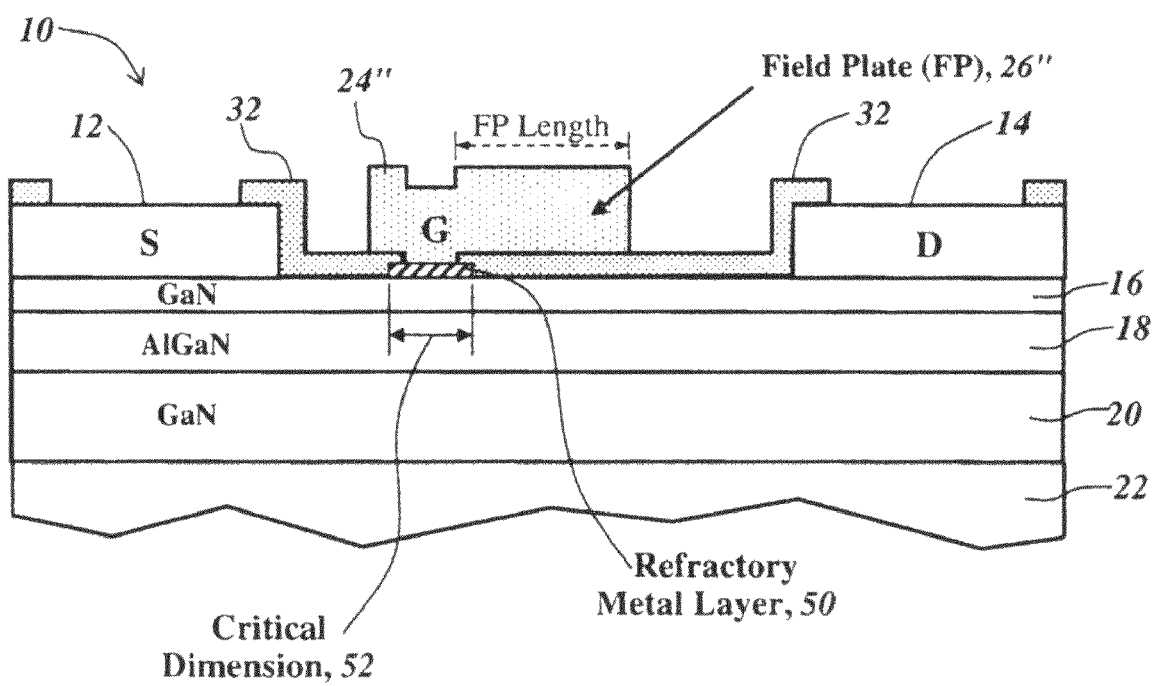
FIG. 3 is a diagrammatic illustration of the subject technique utilizing a thin refractory metal layer that provides gate length control and prevents damage to the FET active device layers.

Referring now to FIG. 3, in the subject technique field effect transistor 10 has an integral gate 24"/field plate 26" structure deposited over an aperture in passivation layer 32 which is deposited over a thin refractory metal layer 50 that preserves the critical dimension 52 against subsequent processing.

What will be appreciated is that regardless of the dry etch processing that may be utilized to provide the aperture in passivation layer 32, the priorly-patterned refractory metal layer 50 maintains the critical dimension 52 regardless of the subsequent processing.

Also, as will be described, thin refractory metal layer 50 protects the underlying substrate, namely layer 16, from being damaged in the process used to etch layer 32. Additionally, the use of the refractory metal layer preserves the critical dimension 52 even in the presence of resist undercutting associated with dry etching.

Referring now to FIGS. 4A-4F, the process for providing the subject field effect transistor is shown.

Figure 4A:
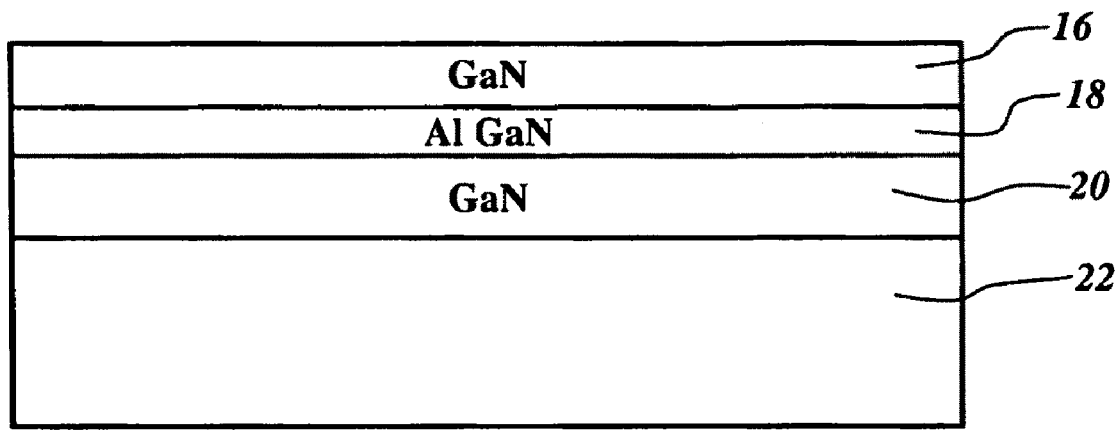
FIGS. 4A-4G are diagrammatic illustrations of the process for providing a critically dimensioned gate electrode for field effect transistors in which a thin refractory metal is first patterned onto a semiconductor substrate, the patterning of which establishes the critical gate dimension, with the additional gate metal deposited over the thin patterned refractory metal layer, also optionally providing for a field plate structure integral to the gate electrode.

As seen in FIG. 4A, a silicon carbide base is for layers 16, 18 and 20.

Figure 4B:
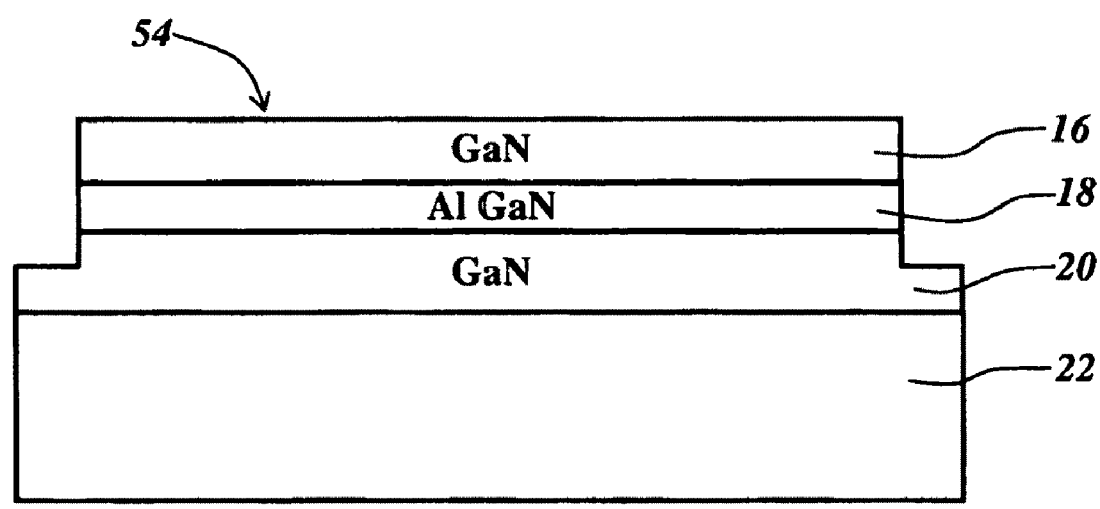

As shown in FIG. 4B, a mesa structure 54 is formed.

Figure 4C:
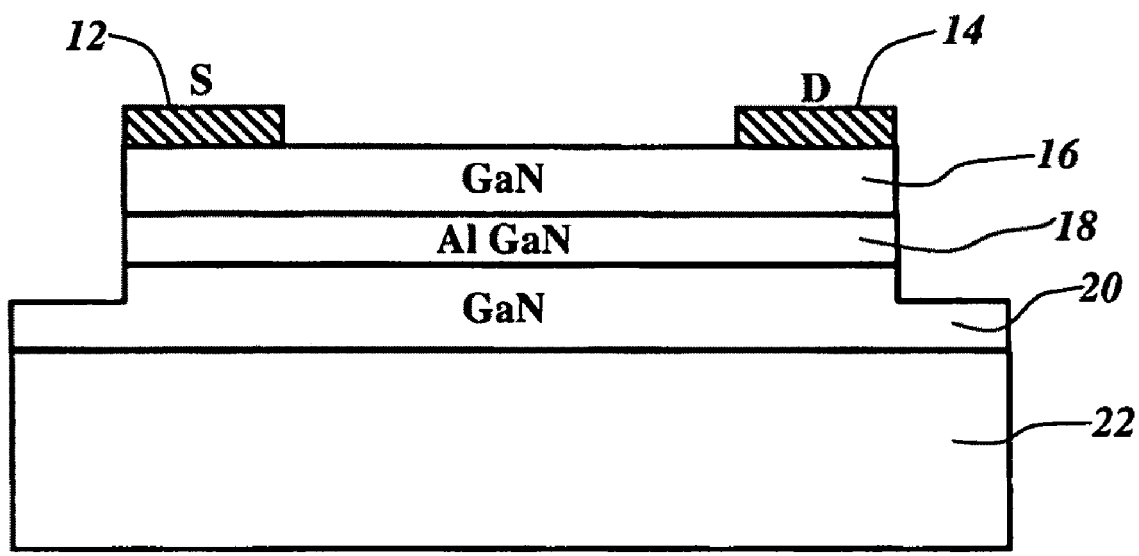

Referring now to FIG. 4C, source and drain electrodes are photolithographically formed on top of gallium nitride layer 16 and are annealed to react with the gallium nitride layer to form an ohmic contact.

Figure 4D:
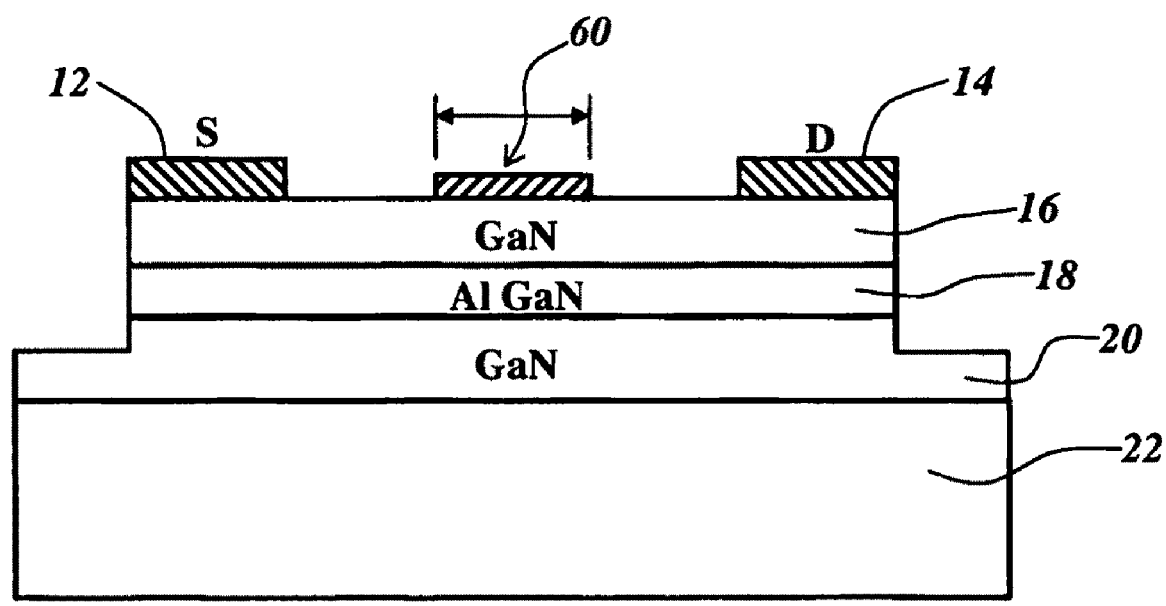

After forming the source and drain regions and referring now to FIG. 4D, a thin refractory metal layer 60 is formed on top of gallium nitride layer 16 to form a gate contact. Layer 60 is also is a protective layer that is useful during a subsequent dry etching process. Note that the refractory metal layer can be centered between the source and drain or can be offset to one side, typically toward the source contact.

In one embodiment, the refractory metal layer is made of nickel. Alternatively, platinum can be used, with nickel and platinum being typical choices for gallium nitride. In one embodiment the thin refractory metal layer is on the order of 50-1,000 angstroms. If one is utilizing gallium arsenide, one can potentially use other metal layers for forming the gate contact as long as it is a reliable Schottky contact on the material.

Figure 4E:
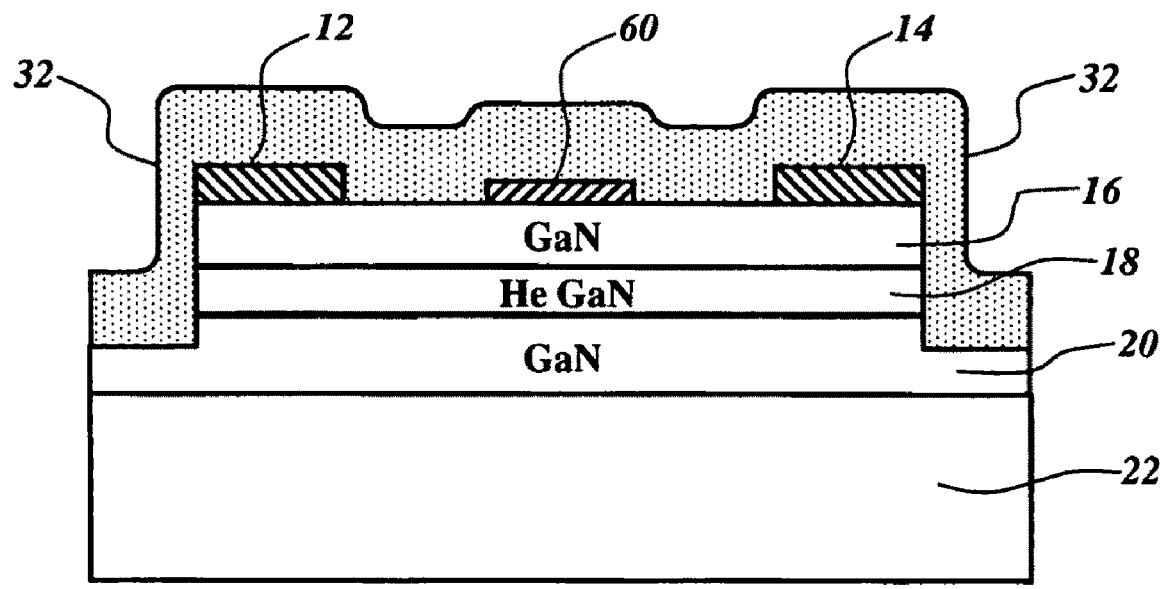

As can be seen in FIG. 4E, a passivation layer 32 is deposited over the entire structure, which passivation layer in one embodiment is provided by plasma-enhanced chemical vapor deposition of silicon nitride. Thus the silicon nitride passivation layer covers all of the metal contacts as well as the active and non-active device areas.

Figure 4F:
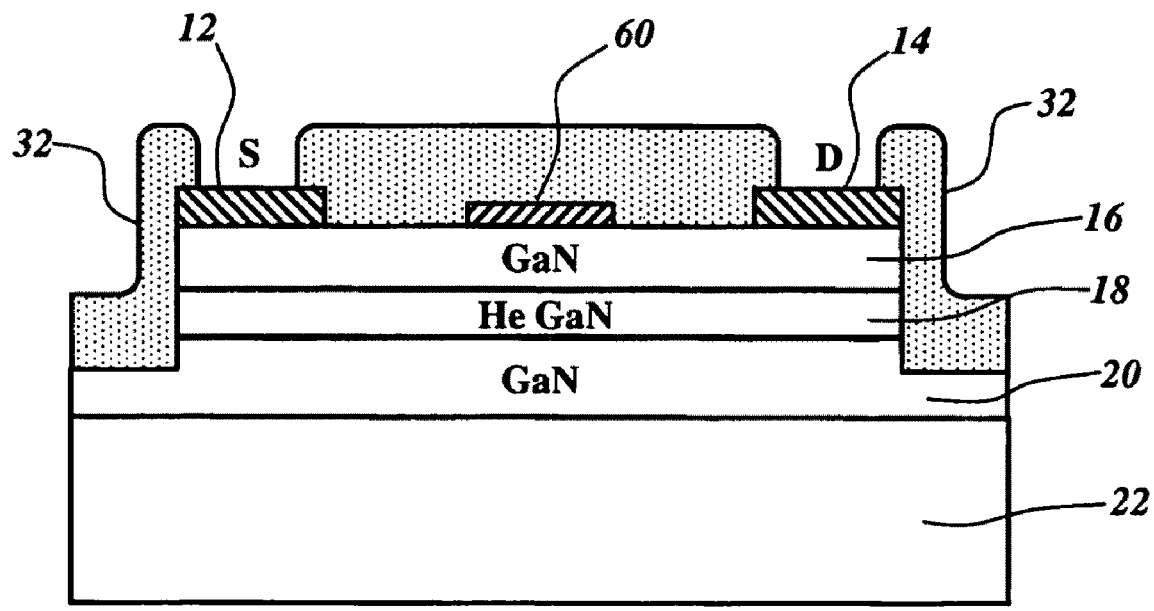

Referring to FIG. 4F, utilizing photolithography, windows are opened in the passivation layer to connect to the ohmic contacts for the source and drain regions. Note that only the source and drains are opened up at this juncture. The gate contact is not opened up at this step because the dimensions are much smaller than the source and drain regions and because one wants to have better control of the lithography on top of the gate contacts. Thus, typically the opening up of the refractory metal layer 60 is done utilizing electron-beam lithography.

Figure 4G:
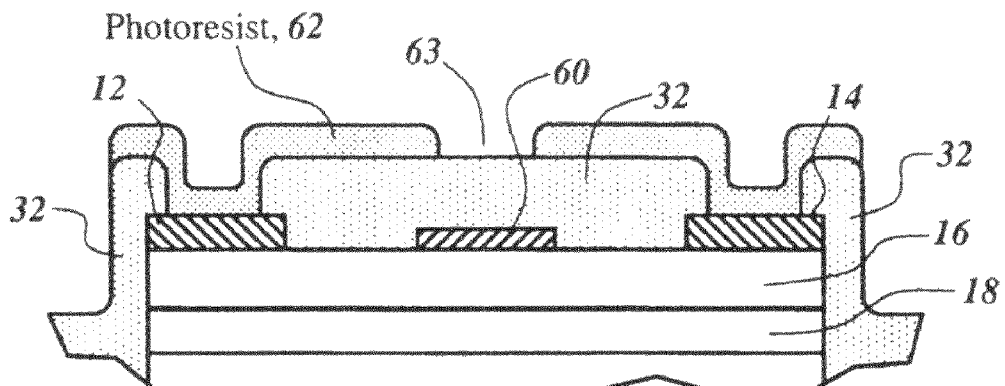

Referring to FIG. 4G, the opening up of the refractory metal layer 60 in one embodiment is accomplished by photolithographically providing a photoresist 62 over the top of the structure formed in FIG. 4F, with the photoresist layer providing an opening 63 either coextensive with or slightly smaller than the dimension of refractory metal layer 60.

Figure 5:
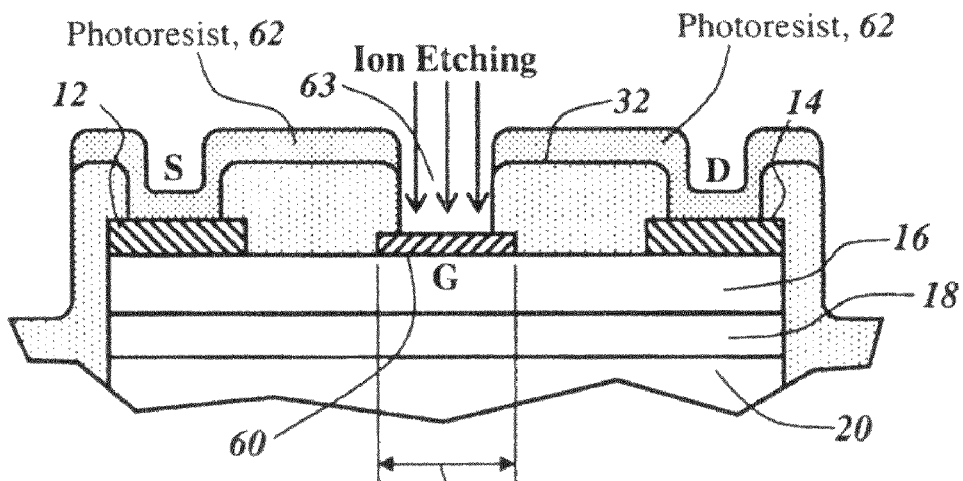
FIG. 5 is a diagrammatic illustration of the utilization of plasma etching of the passivation layer over the refractory metal layer, indicating the critical gate length control preserved by the patterned refractory metal layer, at the same time precluding damage to the underlying substrate and undercutting associated with the dry etch technique of the prior art.

Referring now to FIG. 5, passivation layer 32, having been photolithographically masked off, is subjected to ion etching utilizing electron-beam lithography, which offers better control of the dimension of the aperture in the passivation layer. This careful control is more desirable for higher-frequency applications where the dimension of gate contact is smaller, but commercial devices that operate at lower frequencies benefit from the utilization of electron-beam lithography for better alignment control.

Electron-beam lithography is fine-line lithography desirable for high-frequency devices. However, while this is useful in commercial applications, commercial applications utilize larger dimensions and longer gate lengths. Thus one can use standard photolithography with reduced dimension control at this step.

Here it is important to note that the dimension illustrated by double-ended arrow 52 is the aforementioned critical dimension, and corresponds in one embodiment to gate length.

Figure 6:
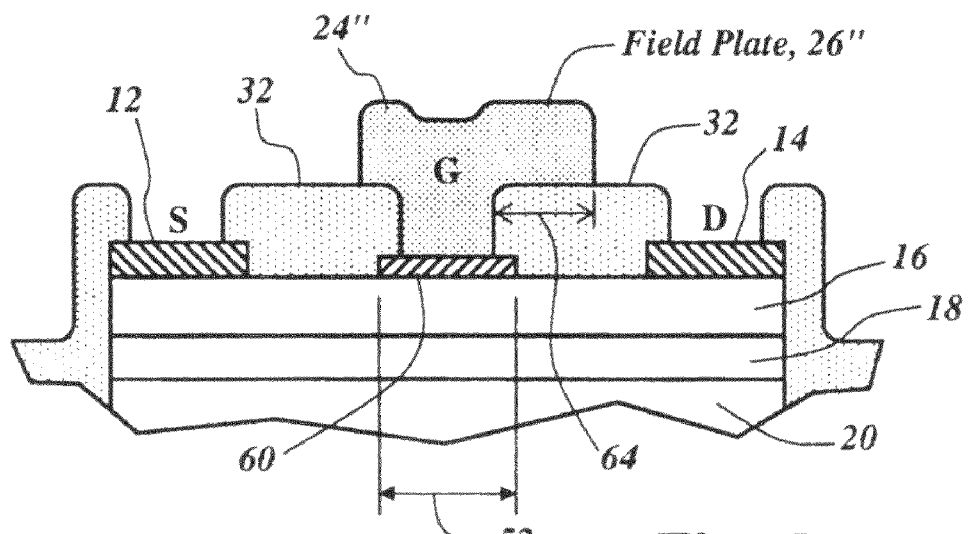
FIG. 6 is a diagrammatic illustration of the formation of the gate and optionally the field plate integral to the gate deposited over the exposed refractory metal layer of FIG. 5.

Referring now to FIG. 6, additional metal for gate electrode 24" is deposited into the etched aperture in passivation layer 32, which extends down to the refractory metal layer 60 that provides Schottky contact to substrate 16 in the active area of the field effect transistor.

In one embodiment a field plate is integrally formed with the gate 24" such that integral field plate region 26" is formed in the same step as the gate electrode. Here the field plate overlap area is shown by double-ended arrow 64. Electron-beam lithography is utilized to deposit metal that covers the open trench on top of the refractory metal layer 60. This gate metal is such that it provides for good adhesion to silicon nitride and also makes a good contact to the underlying refractory metal layer that one already has in place.

In the FIG. 6 embodiment the field plate extends toward the drain because that is where the high electric field is in the field effect transistor. Note that the field plate can be made smaller for higher frequency or larger for lower frequencies. However, a bigger field plate will allow one to operate at higher voltages. Thus, there is a tradeoff between frequency performance versus high-voltage operation.

It should also be noted that there is no gap between the field plate and the gate due to the integrated structure.

Figure 7:
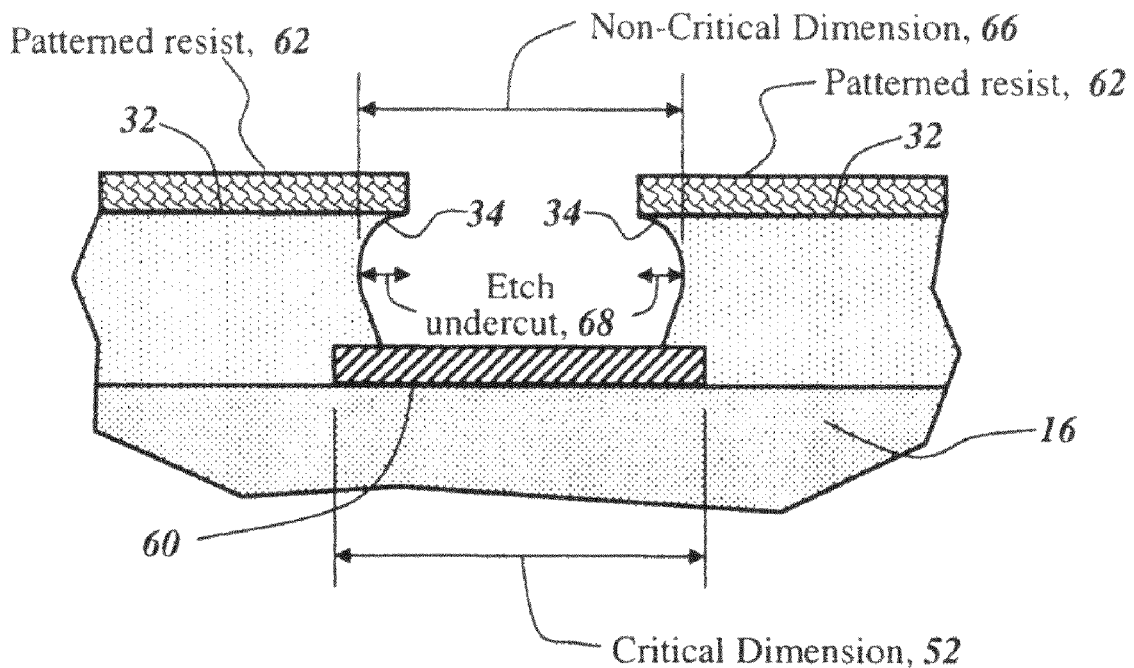
FIG. 7 is a diagrammatic illustration of the preservation of the critical gate dimensions due to the thin refractory metal layer on top of the substrate; and, FIG. 8 is a diagrammatic illustration of the resist undercutting and damage due to the use of a direct etch technique in which the refractory metal layer is not used.

By way of comparison and referring to FIG. 7, critical dimension 52 shown by the corresponding double-ended arrow is preserved by the pre-patterned thin refractory metal layer. Note that in ion etching or dry etching of passivation layer 32, sidewalls 34 exhibit etch undercut 68 due to the abrasion of the ion etching regardless of the high accuracy of this technique. This well-known effect is referred to as "etch undercut" as indicated in FIG. 7. The result is that the dry etch opens a window over refractory metal layer 60, with a not-well-controlled dimension 66. This dimension is, however, non-critical.

It will be appreciated that not only does the refractory metal layer provide for the critical dimension but also prevents erosion and damage to the underlying substrate, here illustrated by layer 16.

Figure 8:
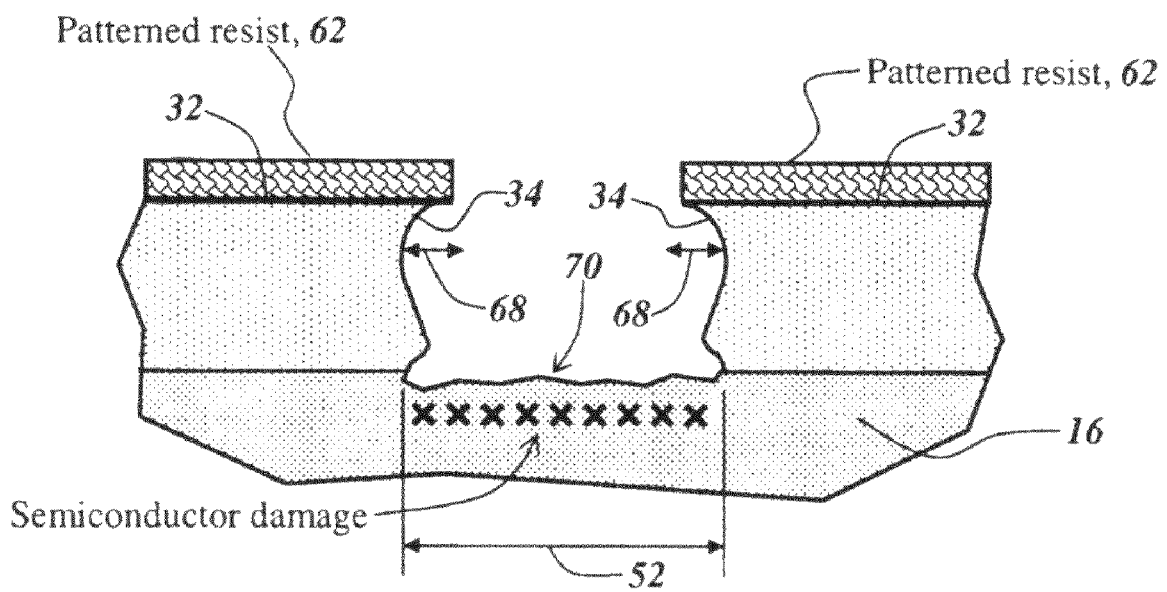

In contrast and as shown in FIG. 8, in the prior-art dry etch technique for providing for the gate electrode, not only are walls 34 tapered and therefore not well controlled, there is also undercutting of the passivation layer 32 as illustrated at 68. This results in a reduction of the accuracy of the critical dimension 52 in the direct dry etch scenario, along with an area 70 which is a damaged surface area in layer 16 right underneath the gate.

For the dry etch technique, the dry etch damage results in the aforementioned traps and at the very least a variation in the characteristic right underneath the gate. If one has some damage at this position, those damage defect sites collect some electrons and take away from the current-carrying channel layer that one has formed underneath the gate. One therefore has reduced current. Moreover, because of the damaged material right underneath the very critical control electrode, namely the gate electrode, one has substantial issues with reliability.

In the subject invention the dimensional accuracy of the refractory metal layer comes directly from the lithography that one is using to pattern this layer and is a very well controlled process utilizing conventional lithography techniques.

On the other hand, with the dielectric-assisted T-gate approach, there is an absence of the refractory metal layer. Because there is no such refractory metal layer, the critical dimension now becomes the dry etch opening, which is much less well controlled compared to the direct lithography utilized to pattern the thin refractory metal layer.

It is important to note that the refractive metal layer that forms the Schottky contact is also a protective layer during the dry etch so that the plasma etching will not attack the gallium nitride layer underneath. This helps with reliability and reduces gate leakage.

As will be appreciated, the same kind of field plate and gate formation is applicable to gallium arsenide-based devices, silicon-based devices or indium phosphide-based devices, all of which can benefit from the subject technique.

Referring back to FIG. 5, it will be appreciated that when one is opening a window directly on top of the gate using electron-beam lithography and a subsequent plasma etch, during the plasma etch the ions are hitting the surface to remove the passivation layer. The refractory metal layer that is the subject of this invention basically stops this erosion process. Note also that the metal layer can absorb any energy that is imparted by the plasma ions. Thus the underlying gallium nitride material does not have to absorb the energy and there is much less damage in the gallium nitride semiconductor layer.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for providing a field effect transistor with an integrally formed field plate in a process that preserves a critical gate dimension to increase the transistor output power, comprising the steps of:
    protecting an upper surface of a field effect transistor at a gate region from a subsequent etching step by overlying the gate region with a precisely patterned metal gate layer having a critical gate dimension on the upper surface at the gate region thereof such that device performance is uniform and consistent regardless of the subsequent etching step, the metal gate layer being formed using a first lithographical pattern, with thin metal gate layer defining the critical gate, dimension including gate lengths;
    depositing a dielectric passivation layer over a semiconductor surface and the metal gate layer;
    defining a second lithographical pattern on the dielectric passivation layer coincident with or slightly inset from the boundaries of the metal layer;
    etching the dielectric passivation layer using a dry or wet etching technique to open up a window above the thin metal gate layer without disturbing the critical gate dimension on the upper surface of the gate region;
    providing a third lithographical pattern over the etched dielectric passivation layer to define a thick metal gate and a field plate integral thereto; and,
    depositing metal in the window to form a gate and field plate, whereby the field effect transistor is provided with the advantage of an integrally formed field plate, whereby the critical gate dimension of the portion of the gate contacting the semiconductor surface is preserved by the original precise patterning of the thin metal gate layer, and whereby the semiconductor surface at the gate is protected from the etching step.

2. The method of claim 1, wherein the field effect transistor is a gallium nitride field effect transistor.

3. The method of claim 1, wherein the field effect transistor is a gallium arsenide field effect transistor.

4. The method of claim 1, wherein the field effect transistor is a silicon carbide field effect transistor.

5. The method of claim 1, wherein the metal gate layer is a Schottky metal gate layer.

6. The method of claim 1, wherein the metal gate layer includes a refractory metal.

7. The method of claim 1, wherein the metal gate layer is thin.

8. The method of claim 7, wherein the thickness of the metal gate layer is on the order of 50-1,000 angstroms.

9. The method of claim 1, wherein the semiconductor surface on which the metal gate layer is patterned on a layer containing gallium nitride.

10. The method of claim 9, wherein the gallium nitride layer is built up on an aluminum gallium nitride layer.

11. The method of claim 10, wherein the aluminum gallium nitride layer is built up on a gallium nitride layer.

12. The method of claim 11, wherein the last-mentioned gallium nitride layer is built up on a base layer.

13. The method of claim 12, wherein the base layer is taken from the group consisting of silicon, silicon carbide, sapphire, aluminum nitride and gallium nitride.

* * * * *